(12) United States Patent
Sahasrabudhe et al.

(10) Patent No.: US 7,411,296 B2
(45) Date of Patent: Aug. 12, 2008

(54) METHOD, SYSTEM, AND APPARATUS FOR GRAVITY ASSISTED CHIP ATTACHMENT

(75) Inventors: Shubhada H. Sahasrabudhe, Gilbert, AZ (US); Nitin A. Deshpande, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 142 days.

(21) Appl. No.: 11/394,853

(22) Filed: Mar. 13, 2006

(65) Prior Publication Data

US 2007/0212868 A1    Sep. 13, 2007

(51) Int. Cl.
*H01L 23/48* (2006.01)
(52) U.S. Cl. .............................. 257/737; 257/E23.021; 438/613

(58) Field of Classification Search ......... 438/106–108, 438/612–617; 257/666, 737, 738, 777, 778, 257/784, E23.021, E23.033, 734
See application file for complete search history.

(56) References Cited

U.S. PATENT DOCUMENTS

2004/0127009 A1* 7/2004 Chen et al. .................. 438/612
2006/0105560 A1* 5/2006 Tseng et al. ................ 438/613

* cited by examiner

*Primary Examiner*—Brook Kebede
(74) *Attorney, Agent, or Firm*—Buckley, Maschoff & Talwalkar LLC

(57) ABSTRACT

A method, system, and apparatus, the apparatus including a metal layer on silicon, photo-resist material disposed on the metal layer, a bump pad reservoir adjacent to the metal layer, a quantity of interconnect metal disposed in the bump pad reservoir, and a resist opening in resist material disposed on a surface of the bump metal and adjacent the interconnect metal. The resist opening may be wider at an open end thereof than at an end in contact with the interconnect metal.

16 Claims, 7 Drawing Sheets

100

200

METHOD, SYSTEM, AND APPARATUS FOR GRAVITY ASSISTED CHIP ATTACHMENT

BACKGROUND

In a process of attaching a die to a substrate, a number of stresses and forces may be introduced and transfer the stresses onto the die, the substrate, and a solder bump joining the die and substrate. Processes to attach the die to the substrate in the manufacture and packaging of integrated circuits (ICs) may include subjecting the die and the substrate to high temperatures and pressures. Due in part to the different materials used in the manufacture of ICs, the materials composing the die and the substrate, for example, may expand and contract at different rates. That is, the die and substrate may have different coefficients of thermal expansion (CTE).

Heating and cooling materials attached at a common interface and having different CTEs may introduce stresses at the interface. For example, shear and peeling stresses may be introduced at an interface between a die and a substrate of an IC during the manufacture and processing of the IC due to the cycling of temperature. Such stresses may contribute to a delamination of the die, the solder bump, and the substrate.

DETAILED DESCRIPTION

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

Figure 1:
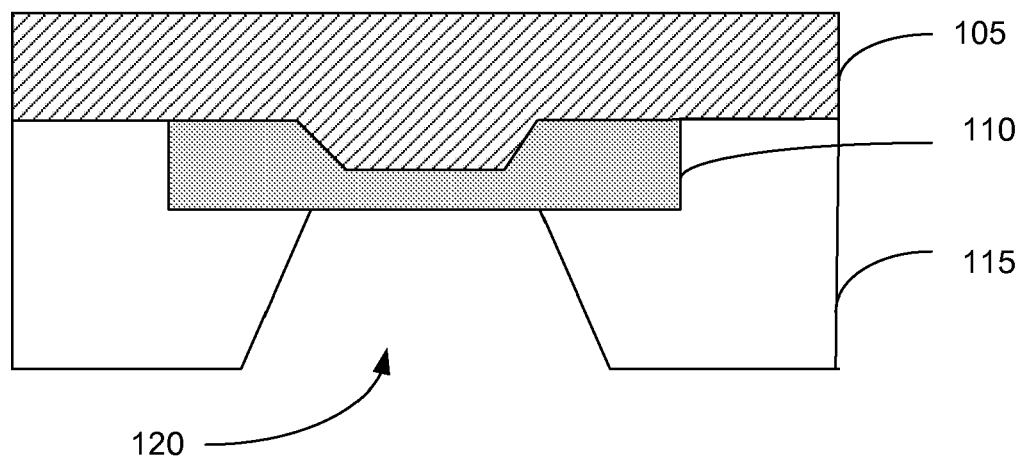
FIG. 1 is an exemplary illustration of an apparatus, in accordance with some embodiments herein.

FIG. 1 is an exemplary depiction of an apparatus in accordance with some embodiments herein. In particular, a device 100 including a bump pad in accordance herewith is shown. Device 100 includes a silicon last metal layer 105. Silicon last metal layer 105 may be on, attached to, or otherwise connected to a layer or layers of silicon (not shown). Interconnect metal 110 is disposed adjacent to silicon last metal layer 105, at least over a portion of a surface of silicon last metal layer 105. Device 100 further includes a resist material 115 that is adjacent to silicon last metal layer 105 at some portions thereof. Resist material 115 may include a wafer polymer resist material.

It is noted that a portion of interconnect metal 110 is disposed between silicon last metal layer 105 and resist material 115. The area occupied by interconnect material 110 is referred to herein as a bump pad reservoir. The bump pad reservoir of FIG. 1 is shown fully filled by interconnect material 110.

A resist opening 120 is shown in resist material 115. Resist opening 120 extends through resist material 115 from interconnect metal 110 to an open end. In some embodiments, resist opening 120 has a funnel-like shape wherein the end adjacent to interconnect metal 115 is narrower than the free space open end of the resist opening.

The composition of last silicon metal later 105, interconnect metal 110, and resist material 115 may include a number and variety of materials compatible with IC manufacturing processes.

Figure 2:
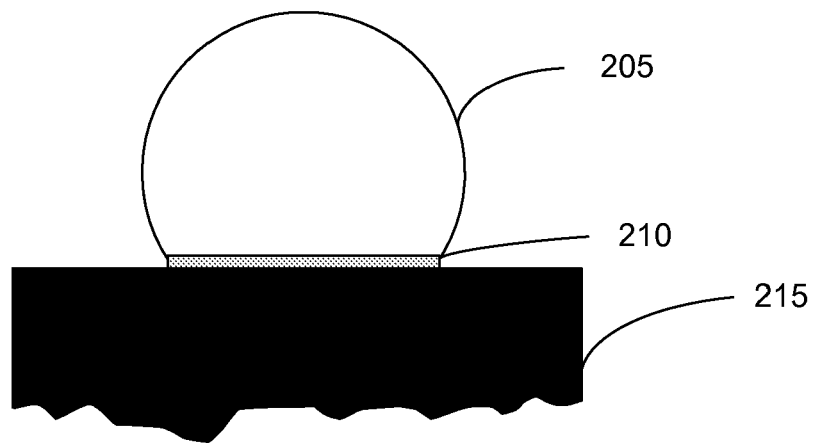
FIG. 2 is an exemplary illustration of an apparatus, in accordance with some embodiments herein.

FIG. 2 is an exemplary device 200, in accordance with some embodiments herein. Device 200 includes a solder ball 205 disposed on a ball pad 210 located on a top surface of a substrate 215. Device 200 may include a solder ball formed and attached to a substrate in a manner consistent with current and future developed IC manufacturing processes and techniques.

The shape and configuration of resist opening 120 disclosed herein facilitates aligning device 100 with a solder bump 205. In some embodiments, the shape of resist opening 120 contributes to a flow of interconnect metal 110 under the influence of a force of gravity.

Figure 3A:
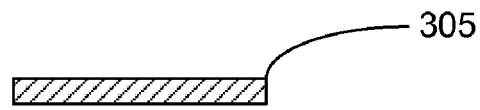
FIGS. 3A-3G are exemplary illustrations of an apparatus at various stages of manufacture, according to some embodiments herein.

FIGS. 3A-3G depict an exemplary apparatus at various stages of manufacture, according to some embodiments herein. FIG. 3A is an illustration of a metal layer 305. In some embodiments, metal layer 305 may be a last metal layer on a layer or layers of silicon material.

Figure 3B:
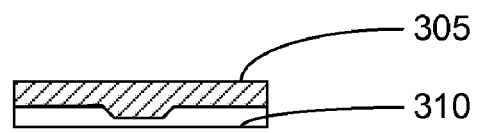

At FIG. 3B a layer of photo-resist material 310 is deposited on metal layer 305. The composition and properties of photo-resist material 310 may be selected to be compatible with IC manufacturing processes and techniques, including those suitable for carrying out the various aspects herein.

Figure 3C:
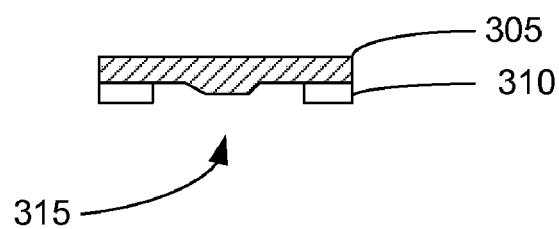

FIG. 3C depicts a stage of processing wherein a portion of photo-resist material 310 has been removed from a portion of metal layer 305. The removal of photo-resist material 310 leaves an area devoid of photo-resist material that is bounded on a number of sides by metal layer 305 and a remaining portion of photo-resist material 310. The area vacated by photo-resist material is referred to herein as a bump pad reservoir 315. In some embodiments, the photo-resist material remaining in FIG. 3C may act to define a boundary of the bump pad reservoir 315.

In some embodiments, a central region of photo-resist material is removed from metal layer 305 to create the bump pad reservoir, as shown in FIG. 3C. Photo-resist 310 may be removed by an etching process, compatible with photo-resist material 310.

Figure 3D:
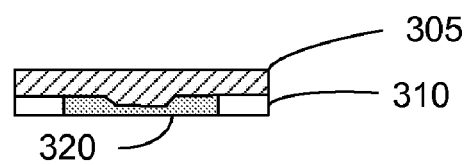

At FIG. 3D a quantity of interconnect metal 320 is deposited into bump pad reservoir 315. The interconnect metal may be any one or combinations of metals and electrically conductive materials suitable for IC devices and the manufacturing and operating environments thereof.

Figure 3E:
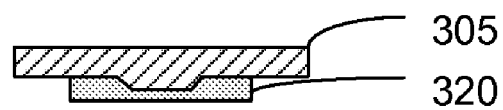

FIG. 3E shows a stage of manufacture wherein photo-resist material 310 surrounding interconnect metal 320 has been removed. In some embodiments, at least photo-resist 310 immediately adjacent to interconnect metal 320 is removed.

Figure 3F:
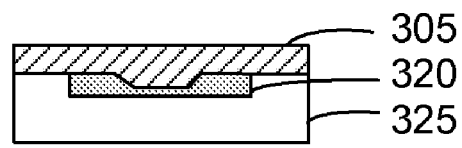

At FIG. 3F a layer of resist material 325 is deposited on the exposed metal layer 305 and interconnect metal 320. In this manner interconnect metal 320 is enclosed within resist material 325, thereby forming the bump pad reservoir comprising interconnect metal 320.

Figure 3G:
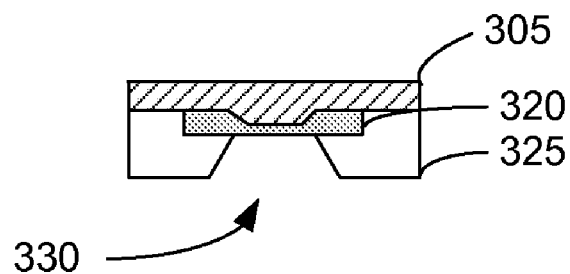

At FIG. 3G, a portion of resist material 325 is removed to create a resist opening 330 in resist material 325. Resist opening 330 opens onto interconnect metal 320 and extends therefrom to on open end. In some embodiments, the free space open end of resist opening 330 is wider than the end adjacent to interconnect material 320. In some embodiments, resist opening 330 has a funnel-like shape, as shown.

In some embodiments, some or all of the steps or operations depicted in FIGS. 3A-3G may be used to create devices of some of the embodiments herein. For example, the device of FIG. 1 may be created using some or all of the operations depicted in FIGS. 3A-3G.

Figure 4A:
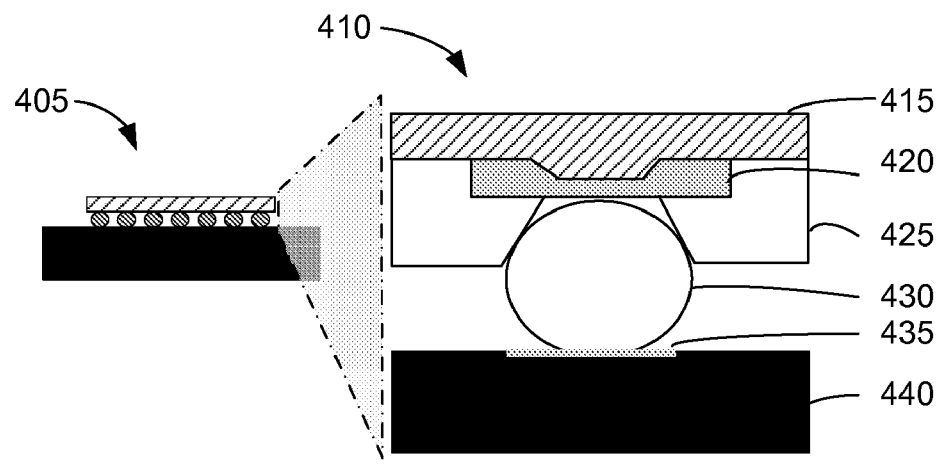
FIGS. 4A-4C are exemplary illustrations of an apparatus at various stages of manufacture, in accordance with some embodiments herein.
Figure 4B:
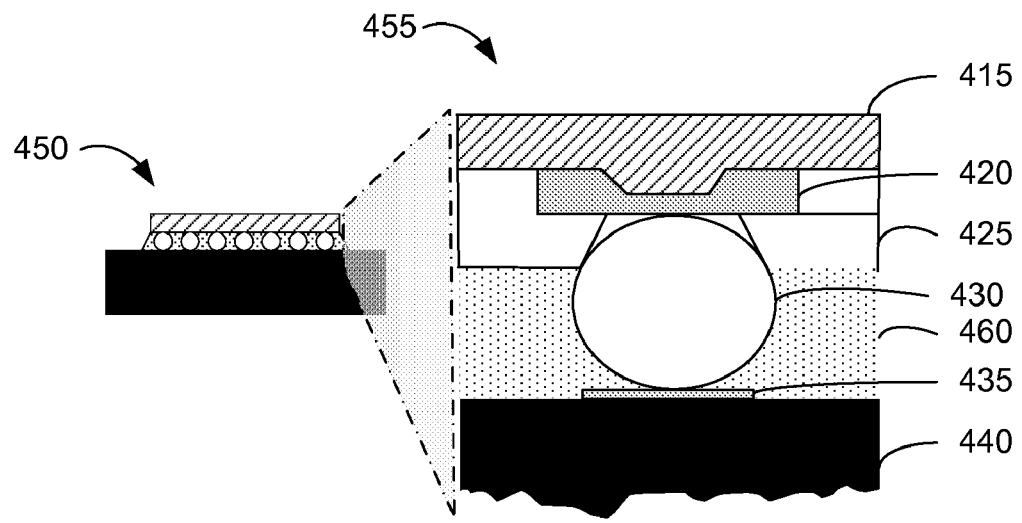
Figure 4C:
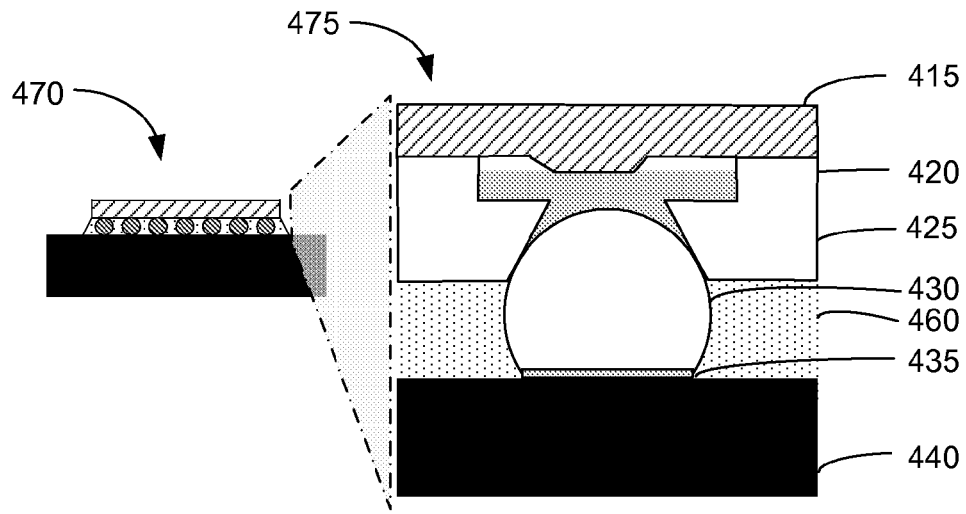

FIGS. 4A-4C are exemplary illustrations of an apparatus at various stages of manufacture, in accordance with some embodiments herein. In particular, FIG. 4A depicts a die pick and place operation in accordance with some embodiments herein, FIG. 4B depicts an underfill injection operation in accordance with some embodiments herein, and FIG. 4C depicts a reflow and underfill cure operation in accordance with some embodiments herein. A left side of FIGS. 4A-4C (405, 450, and 470) illustrates the particular operations and the right side of FIGS. 4A-4C (410, 455, and 475) shows a detailed illustration of the particular operations.

FIG. 4A illustrates how the bump pad geometry of the devices disclosed herein facilitate efficient alignment of a die and a substrate during a die pick and place operation. For example, a die having a resist opening in resist material 425 configured as disclosed herein may assist in aligning the die with a substrate 440 having a solder ball 430 on a ball pad 435 on the substrate. The die includes a silicon metal layer, interconnect metal 420, and resist material 425. Accordingly, in accordance with some of the embodiments herein, alignment of a die may be simplified. The particular configurations of the devices disclosed herein, alone and in conjunction with some of the processes herein, facilitate and provide a mechanism for an efficient die alignment procedure.

In some embodiments, the resist opening may have a funnel-like shape. In some embodiments, geometrical tolerances for the resist opening, resist material 425, and solder ball 430 may be determined such that a substantially airtight seal is created at an interface between resist material 425 and solder ball 430 when the die is placed on the solder ball.

At FIG. 4B underfill material 460 is disposed in an area between the substrate and resist material 425. Due, at least in part, to the seal at the interface between solder ball 430 and resist material 425, underfill material 460 is disposed in some embodiments only to the area between substrate 440 and resist material 425. In this manner, underfill material 460 may be constrained from migrating into an area between solder ball 430 and interconnect metal 420.

In some embodiments, underfill material 460 is selected such that it fills the area between a lower surface of the resist opening and a top surface of substrate 440 based on a capillary action such that it does not wet a topside of solder ball 430 within the resist opening. Selection of the appropriate underfill material may be based on the composition and filler material size to achieve the desired flow characteristics.

In some embodiments, a cure of underfill material 460 is not provided at FIG. 4B.

At FIG. 4C the device may be subjected to a reflow process to complete a first level interconnect and an underfill cure process. The reflow process is designed to: (i) melt interconnect metal 420 to create a flow thereof from the bump pad reservoir through the resist opening to the top of solder ball 430, and (ii) cure underfill material 460. The reflow process may employ a number of reflow profiles to achieve the desired first level interconnect and the underfill cure. One reflow profile in accordance herewith may include curing of the underfill at a first temperature and then increasing the temperature to a second temperature (above the melting temperature of the interconnect metal) to melt the interconnect metal.

Figure 5A:
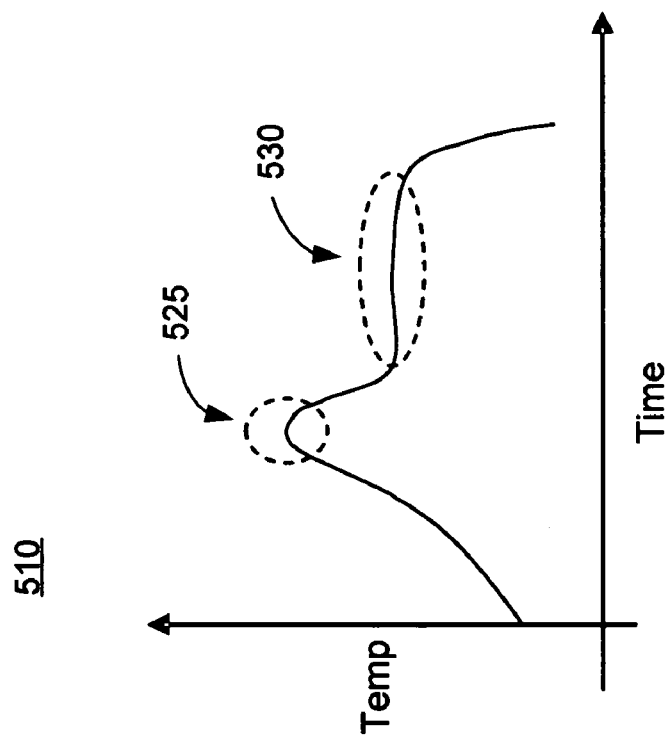
FIGS. 5A and 5B are graphs of certain characteristics, in accordance with some embodiments herein.

FIG. 5A depicts a reflow profile 505 wherein the underfill is cured at a temperature (e.g., epoxy cure 515) and then the temperature is increased to a temperature above the melting temperature of the interconnect metal to melt the interconnect metal (e.g., chip attach 520).

In some embodiments, a reflow profile may include melting the interconnect metal at a third temperature above the melting temperature of the interconnect metal for a first duration of time and then decreasing the temperature to a fourth temperature for a second duration of time to cure the underfill, wherein the first duration of time is less than the second duration of time.

In accordance with some of the embodiments herein, the configuration of the bump pad reservoir and the resist opening cooperate to provide and facilitate a flow of the interconnect metal from the bump pad reservoir. In particular, some of the device configurations and processes herein are aided by a force of gravity to facilitate and/or encourage the flow of the interconnect metal.

Figure 5B:
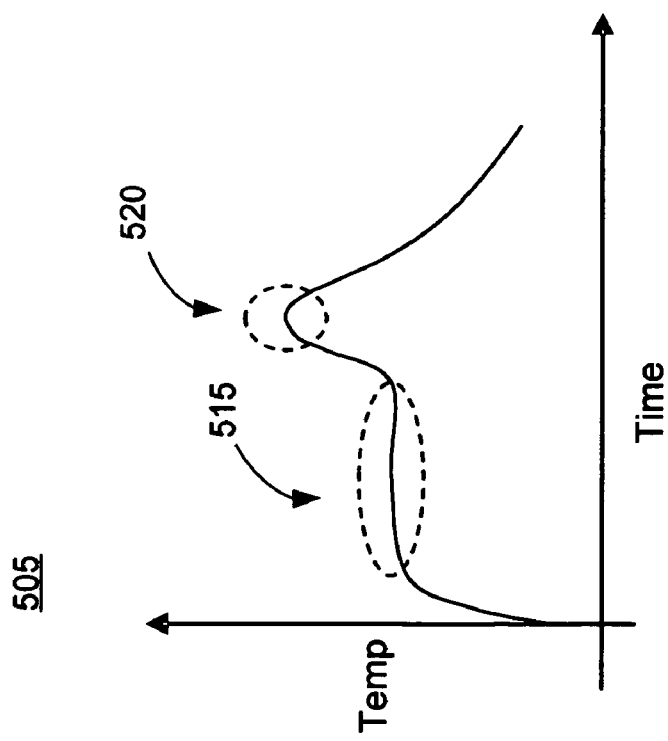

FIG. 5B depicts a reflow profile that includes melting the interconnect metal at a temperature above the melting temperature of the interconnect metal for a first duration of time (e.g., chip attach 526) and then decreasing the temperature a lower temperature for a second duration of time to cure the underfill (e.g., epoxy cure 530). The first duration of time is less than the second duration of time.

In some embodiments, the shape and configuration of resist opening disclosed herein facilitates aligning silicon device 415 with solder ball 430. In some embodiments, the shape of the resist opening (i.e., narrower at the end contacting interconnect metal 420 than at the open end) contributes to a flow of interconnect metal 420 under the influence of the force of gravity.

In some embodiments, adjustments to a geometry and manufacturing aspect of the operations herein made be made to minimize or otherwise mitigate a stress (if any) attributable to a void created in an area of the bump pad reservoir resulting from the flow of the interconnect metal therefrom.

In some embodiments, a cool down process may occur after the reflow and underfill operation of FIG. 4C. Stresses, if any, induced at interlayer dielectric layers of the device of FIG. 4C may be relatively low due to the curing of the underfill during the operation of FIG. 4C.

In some embodiments, the reflow profiles of FIGS. 5A and 5B may be used to implement a single reflow process for a chip attachment and underfill cure.

Figure 6:
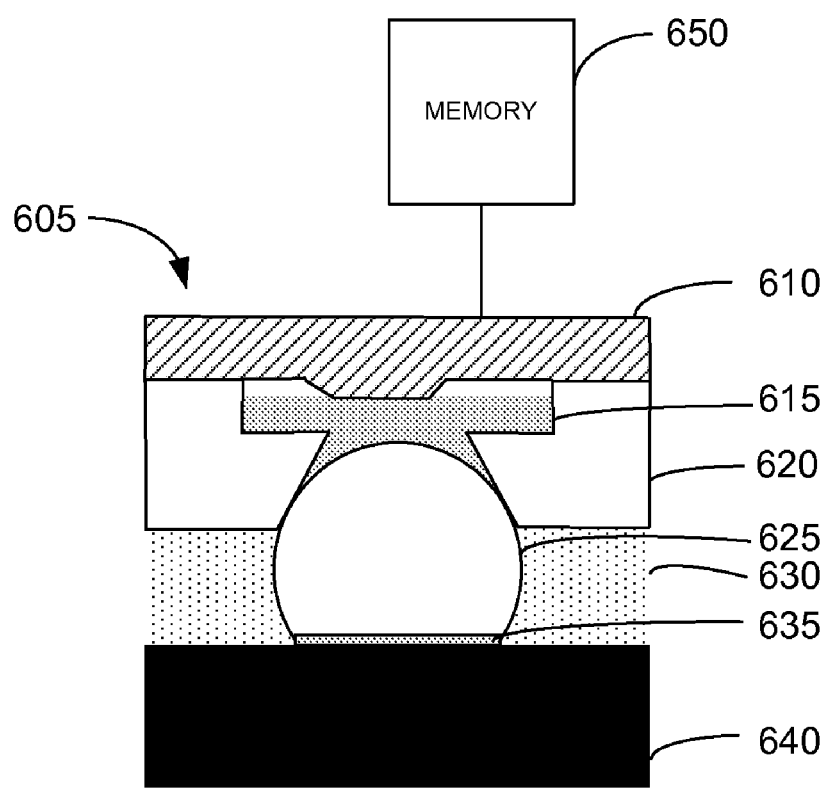
FIG. 6 is a schematic diagram of a system, in accordance with some embodiments herein.

FIG. 6 is an exemplary depiction of a system 600 including an apparatus, for example a flip chip IC package 605, having a solder ball 625 interfaced or engaged with a bump pad interconnect metal 615, in accordance with some embodiments herein. Solder ball 625 may be located on a bump pad 635 that is on a surface of a substrate 640. Flip chip 605 may include a last metal layer 610 on silicon, a resist material 615 (e.g., wafer polymer resist) having a funnel-shaped resist opening therein to receive solder ball 625, and underfill material 630, as described herein with respect to various embodiments.

Flip chip 605 may be connected to an IC 650. Those in the art should appreciate that system 600 may include additional, fewer, or alternative components to flip chip 605 and memory 650. IC 650 may comprise any type of device, such as a processor and a memory. In the instance IC 650 is a memory, the memory may include, for example, a Single Data Rate Random Access Memory, a Double Data Rate Random Access Memory, or a Programmable Read Only Memory.

In some embodiments herein, various aspects of the disclosure herein cooperate to reduce the stresses of a chip attachment process and device. For example, the aspects of one step curing and reflow process, as well as the gravity-assisted features, may combine to reduce the stresses of a chip attachment process and device.

It should be appreciated that the drawings herein are illustrative of various aspects of the embodiments herein, not exhaustive of the present disclosure. For example, FIG. 6 is simplified for considerations of clarity. While not shown, it should be appreciated that FIG. 6 may include a plurality of solder balls and solder resist openings to interface with and receive the plurality of solder balls.

The several embodiments described herein are solely for the purpose of illustration. Persons in the art will recognize from this description that other embodiments may be practiced with modifications and alterations limited only by the claims.

What is claimed is:

1. A method comprising:
    disposing a photo-resist material on a metal layer on silicon;
    forming a bump pad reservoir adjacent to the metal layer in a portion of the photo-resist material;
    placing a quantity of interconnect metal in the bump pad reservoir;
    disposing a resist material on a surface of the interconnect metal; and
    forming an opening in the resist material adjacent the interconnect metal, wherein the opening is wider at an open end thereof than at an end in contact with the interconnect metal and the bump pad reservoir is devoid of photo-resist material and bounded by the interconnect metal and the photo-resist material.

2. The method of claim 1, further comprising depositing the metal layer on the silicon.

3. The method of claim 1, wherein the forming of the bump pad reservoir includes removing at least a portion of the photo-resist material on the metal layer.

4. The method of claim 1, wherein the forming of the opening in the resist material adjacent the interconnect metal includes removing a quantity of the resist material.

5. The method of claim 1, wherein the resist material comprises a wafer polymer resist material.

6. An apparatus comprising:
    a metal layer on silicon;
    photo-resist material disposed on the metal layer;
    a bump pad reservoir adjacent to the metal layer;
    a quantity of interconnect metal disposed in the bump pad reservoir; and
    a resist opening in resist material disposed on a surface of the interconnect metal and the adjacent interconnect metal, wherein the resist opening is wider at an open end thereof than at an end in contact with the interconnect metal and the bump pad reservoir is devoid of photo-resist material and bounded by the interconnect metal and the photo-resist material.

7. The apparatus of claim 6, wherein the bump pad reservoir is formed by disposing a photo-resist material on the metal layer and removing at least a portion of the photo-resist material adjacent the metal layer.

8. The apparatus of claim 6, wherein the resist material comprises a wafer polymer resist material.

9. The apparatus of claim 6, wherein the resist opening is sized to engage with a solder ball, wherein an airtight seal is established at an interface between the solder ball and the resist opening.

10. The apparatus of claim 6, wherein a flow of the interconnect metal is assisted to flow from the bump pad reservoir into the resist opening to a solder ball by a force of gravity.

11. A system comprising:
    a metal layer on silicon;
    photo-resist material disposed on the metal layer;
    a bump pad reservoir adjacent to the metal layer;
    a quantity of interconnect metal disposed in the bump pad reservoir;
    a resist opening in resist material disposed on a surface of the interconnect metal and adjacent the interconnect metal, wherein the resist opening is wider at an open end thereof than at an end in contact with the interconnect metal;
    a solder ball on a substrate, wherein an upper portion of the solder ball is partially positioned in the resist opening and electrically connected to the metal layer by the interconnect metal; and
    an integrated circuit (IC) electrically connected to the substrate.

12. The system of claim 11, wherein the IC comprises a double date rate memory module.

13. The system of claim 11, further comprising a printed circuit board connected to the substrate.

14. The system of claim 11, wherein the resist material comprises a wafer polymer resist material.

15. The system of claim 11, wherein the resist opening is sized to engage with a solder ball, wherein an airtight seal is established at an interface between the solder ball and the resist opening.

16. The system of claim 11, wherein a flow of the interconnect metal is assisted to flow from the bump pad reservoir into the resist opening to a solder ball by a force of gravity.

* * * * *